United States Patent [19]
Minami et al.

[11] Patent Number: 6,157,248
[45] Date of Patent: Dec. 5, 2000

[54] ACTIVE FILTER CIRCUIT

[75] Inventors: Yoshihisa Minami, Otsu; Masaru Yasuda, Nara, both of Japan

[73] Assignee: Matsushita Electric Industrial Co., Ltd., Japan

[21] Appl. No.: 09/299,796

[22] Filed: Apr. 26, 1999

[30]   Foreign Application Priority Data

May 20, 1998  [JP]  Japan ................................. 10-137837

[51] Int. Cl.$^7$ ..................................................... G05F 1/00
[52] U.S. Cl. ......................... 327/552; 327/557; 327/556; 330/306
[58] Field of Search ................................. 327/552, 556, 327/557, 555; 330/303, 306, 107, 108

[56]    References Cited

U.S. PATENT DOCUMENTS 5,317,217   5/1994  Rieger et al. ......................... 327/555

FOREIGN PATENT DOCUMENTS 62-285508  12/1987  Japan .
63-187808   8/1988  Japan .
5-76029     3/1993  Japan .

*Primary Examiner*—Dinh T. Le
*Attorney, Agent, or Firm*—Rosenthal & Osha L.L.P.

[57]           ABSTRACT

An active filter circuit (a band stop filter type or a band pass filter type) having high Q value and high efficiency and which is suitable for integration has an input signal vi inputted from the input terminal supplied to the non-inverting input terminal of the first differential amplifier. The output terminal of the first differential amplifier is connected to the non-inverting input terminal of the second differential amplifier, and the first capacitor 3 is connected between this connection line and the alternate current ground. An output of the second differential amplifier is connected to the non-inverting input terminal of the first differential amplifier via the second capacitor, the inverting input terminal of the first differential amplifier, the inverting input terminal of the second differential amplifier 4, the non-inverting input terminal of the third differential amplifier, the output terminal of the third differential amplifier and the output terminal of the active filter circuit. An inverting input terminal of the third differential amplifier is connected to alternate current ground. The output of the second differential amplifier becomes the output signal vo of the active filter circuit.

8 Claims, 11 Drawing Sheets

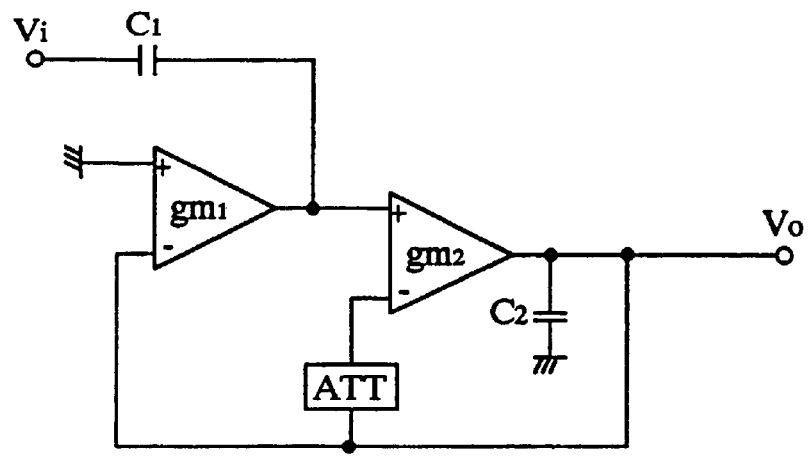
FIG. 10
*(Prior Art)*
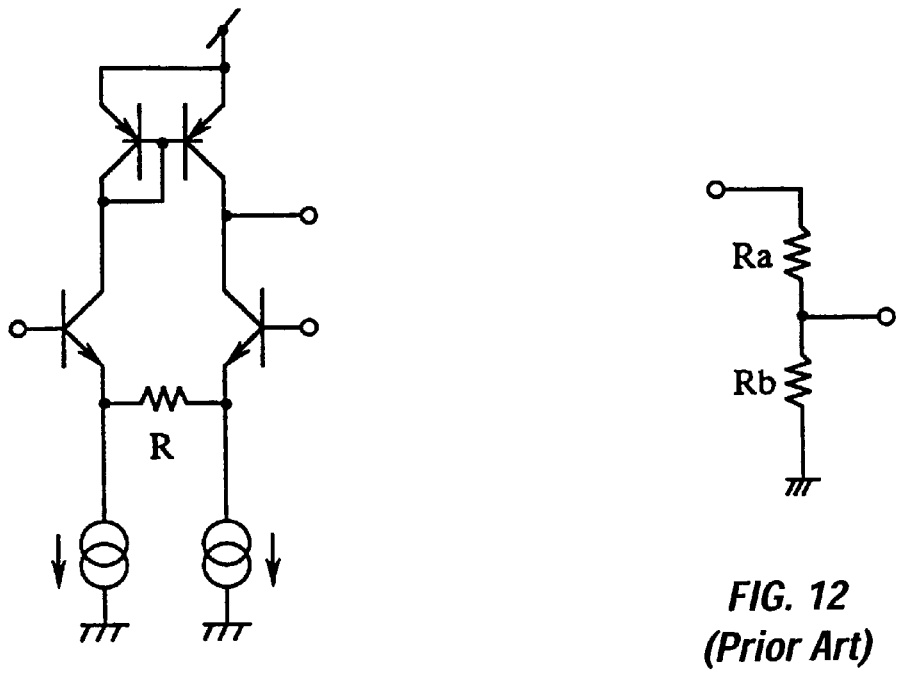
FIG. 11
*(Prior Art)*
FIG. 12
*(Prior Art)*

ACTIVE FILTER CIRCUIT

BACKGROUND OF THE INVENTION

1. Field of the Invention

This invention relates to an active filter having high Q value composed by the semiconductor integrated circuit.

2. Description of the Related Art

An example circuit of an active filter as a band stop filter (hereinafter, it is referred to as "TRAP") and an example circuit of an active filter for a band pass filter (hereinafter, it is referred to as "BPF"), which are generally used in conventional technology, are shown in FIG. 7 and FIG. 8 respectively. A transfer function H1 of the TRAP shown in FIG. 7 is described by Equation 1 if an inverse of a conductance $gm_1$ of the first differential amplifier is represented as $R_1$ and an inverse of a conductance $gm_2$ of a second differential amplifier is represented as $R_2$. A transfer function H2 of the BPF shown in FIG. 8 is described by Equation 2.

$$H1=(S^2+1/C_1C_2R_1R_2)/(S^2+S/C_2R_2+1/C_1C_2R_1R_2) \quad \text{(Equation 1)}$$

$$H2=(S/C_2R_2)/(S^2+S/C_2R_2+1/C_1C_2R_1R_2) \quad \text{(Equation 2)}$$

When the Q value of the TRAP and the BPF are represented as $Q_1$ and $Q_2$ respectively, those values are described by following Equation 3 and Equation 4 respectively.

$$Q_1=(C_2R_2/C_1R_1)^{1/2} \quad \text{(Equation 3)}$$

$$Q_2=(C_2R_2/C_1R_2)^{1/2} \quad \text{(Equation 4)}$$

Therefore, adjustment of the Q values in the TRAP and the BPF can be performed by controlling and adjusting at least one value selected from the group of $C_1$, $R_1$, $C_2$, and $R_2$.

The Q value can be enlarged by inserting an attenuator (ATT) to the inverting input of the second differential amplifier as shown in FIG. 9 and FIG. 10 as a method for providing a margin to the variable range of the Q value of the TRAP and the BPF. When an attenuation ratio of the attenuator (ATT) is represented as $1/\alpha$, the transfer function H3 of the TRAP shown in FIG. 9 and the transfer function H4 of the BPF shown in FIG. 10 are described by Equation 5 and Equation 6 respectively.

$$H3=(S^2+1/C_1C_2R_1R_2)/(S^2+S/\alpha C_2R_2+1/C_1C_2R_1R_2) \quad \text{(Equation 5)}$$

$$H4=(S/C_2R_2)/(S^2+S/\alpha C_2R_2+1/C_1C_2R_1R_2) \quad \text{(Equation 6)}$$

Both the second term of the denominator of Equation 5 and Equation 6 are terms showing a Q value as a general style and both third terms are terms showing $\omega_0$. Therefore, following Equation 7 and Equation 8 can be reached. Wherein, the Q value is described by Equation 8 which results from Equation 7.

$$\omega_0/Q=1/\alpha C_2R_2 \quad \text{(Equation 7)}$$

$$\omega_0^2=1/C_1C_2R_1R_2$$

$$Q=\alpha(C_2R_2/C_1R_1)^{1/2} \quad \text{(Equation 8)}$$

As understood from Equation 8, the Q value will be enlarged when $\alpha$ is enlarged (it means that the attenuation value is enlarged). Moreover, $\alpha$ is not an element of the square root operation. Therefore, a high Q value can be obtained more easily than the case when achieving a high Q value by adjusting the value of the capacitor or the value of the resistance.

Recently, many IC circuits employ and include various filters. Among those filters, in many cases, a steep characteristic will be required. In this case, a high Q value becomes indispensable. In order to enlarge the Q value in the above-mentioned equations Equation 3 and Equation 4, the value of $R_2$ or $C_2$ should be reduced, or the value of $R_1$ or $C_1$ should be enlarged. It is possible to achieve the Q value adjustment by changing the ratio of the resistance or the ratio of the capacitor if Q is about 2 to 3. However, there is a restriction on the upper limit of the Q value for practical use because there is a restriction on the value of the resistance and the value of the capacitors especially on the lower limit of those values for practical use without any problems.

Moreover, when adjusting the Q value automatically by regarding the type of the differential amplifiers included in the active filter as a variable conductance type, both values of the variable conductance elements of whole filter, which are corresponding to the variable conductance $gm_1$ and $gm_2$, should be adjusted as equivalent values in order to improve gm variable balance of whole filter. Therefore, the upper limit of the Q value which can be achieved will be further decreased because $R_1$ and $R_2$ can not be used for the adjustment of the Q value, and the adjustment of the Q value should be performed only by adjusting and controlling the value of the $C_1$ and the $C_2$. The Q value which can be achieved by the available capacitors will be about 3–4 at most considering the maximum value of the capacitors which can be used in practical use and the minimum value of the capacitors which can be used without problem on its accuracy.

In order to obtain a high Q value under such a condition, the circuit structure shown in FIG. 9 and FIG. 10 can be utilized. The Q value of the TRAP shown in FIG. 9 and the BPF shown in FIG. 10 can be adjusted by varying and adjusting the attenuation ratio $1/\alpha$ of the ATT instead of varying the value of $R_1$, $R_2$, $C_1$ or $C_2$ as shown by FIG. 8. By this method, a very high Q value can be achieved.

However, there are the following problems. Most of analog integrated circuits of which the active filter is composed has a single power supply source. Most of those ICs are used with a single positive power supply voltage or a single negative power supply voltage to the earth potential of 0 V. A typical example circuit of the differential amplifier of the conductance part, which is included in the active filter shown in FIG. 7 to FIG. 10, is shown in FIG. 11. As understood from FIG. 11, when the circuit uses a single power supply source, the circuit elements are designed for performing around a working point supplied by the DC bias. As for the ATT used in the circuit shown in FIG. 9 and FIG. 10, a simple voltage dividing circuit, which can adjust the working point of the grounding type shown in FIG. 12 to 0 V, is not available. It is necessary to use the ATT which can perform around a working point by being supplied the DC bias as shown the circuit enclosed with broken line in FIG. 13. The emitter of the transistor $Q_1$ corresponds to the input terminal of FIG. 12, and the emitter of the transistor $Q_2$ corresponds to the grounding point of FIG. 12.

The buffer circuit including an op-amp shown in FIG. 14 (a) or the buffer circuit including transistor circuits shown in FIG. 14 (b) to (e) might be used instead of the transistor $Q_1$ and transistor $Q_2$ of FIG. 13. Moreover, when the Q value is a specific value, the ATT can be composed by utilizing a grounding type voltage dividing circuit as shown in FIG. 15. However, the adjustment of the DC bias of I/O becomes difficult. Therefore, the circuit elements for the DC adjustment will be necessary additionally. As mentioned above, the DC output level will be fluctuated if the Q value is varied. Therefore, varying and controlling the Q value becomes difficult, and the Q value will be limited to as a specific value. For this reason, the circuit configurations shown in FIGS. 14 (*a*) to (*e*) are hardly used, and the circuit configuration shown in FIG. 13 is mainly used.

In FIG. 13, in order to vary the Q value, the ratio of Ra and Rb are varied, and the amount of attenuation of the ATT is varied. Attenuation ratio $1/\alpha$ for the output $V_{ATT}$ from the emitter of the transistor $Q_2$ of the ATT part shown in FIG. 13 is described by Equation 9.

$$1/\alpha = Rb/(Ra+Rb) \qquad \text{(Equation 9)}$$

In order to enlarge $\alpha$ and to raise the Q value, it is necessary to enlarge the value of Ra and reduce the value of the Rb. However, the minimum value of the Rb is limited by the influence of the impedance re of the buffer (transistor) $Q_2$ as the value of the Rb becomes small, and the maximum of the Q value is limited. For instance, if the current of the emitter of the transistor $Q_2$ is assumed to be 100 $\mu$A, the value of the re becomes 260 $\Omega$ and the value of the Rb becomes several k$\Omega$ or more when the influence of the re does not become a problem. It is necessary to reduce the value of the re of the $Q_2$ in order to obtain a small value of the Rb, and it is necessary to increase the current of the emitter of the transistor $Q_2$ in turn. However, this method is not preferable because the power consumption will be increase and the size of the transistor will become large which in turn increases the IC chip area.

If $\alpha$ is enlarged without reducing the value of the Rb, the value of the Ra becomes large. However, it is necessary to suppress the value of the Ra below hundreds of k$\Omega$ level in order to secure the accuracy of the value of the Ra. Moreover, if the ratio of the resistance Ra and the resistance Rb becomes too large, the relative accuracy of the Ra and the Rb worsens. In this case, it is necessary to suppress the difference between the Ra and the Rb within one digit order.

Considering the accuracy of the obtained attenuation ratio under above mentioned condition, it is preferable for setting the value of the Ra and the Rb within several k$\Omega$ and tens of k$\Omega$ respectively. For instance, the attenuation ratio $1/\alpha$ becomes the value described by the Equation 10 when assuming re=260 $\Omega$, Rb=2 k$\Omega$, and Ra=50 k$\Omega$.

$$\begin{aligned} 1/\alpha &= (Rb+re)/(Ra+Rb+2re) \\ &= (2000+260)/(50000+2000+520) \\ &= 1/23.2 \end{aligned} \qquad \text{(Equation 10)}$$

In this case, the upper limitation of the obtained Q value becomes about 20. In Equation 10, because the a becomes 26 when re is 0 $\Omega$, it is understood that the $\alpha$ has decreased by about 10% by the influence of re. In order to reduce the influence of re, the obtained Q value should be lowered, the current of the emitter of the transistor should be increased or the absolute value of the Ra and the Rb should be increased. However, because the increasing of the current of the emitter as mentioned above leads to the increase of the power consumption and the IC chip area, in addition, the increasing of the absolute value of the Ra and the Rb leads to the increase of the IC chip area, the configuration shown by FIG. 13 is not preferable from the view point of the resource saving and the energy conservation. After all, about the value 20 becomes the upper bounds as for the Q value obtained by the simple conventional circuit configuration. On the other hand, a preferable value is 30 or more as the Q value for a filter having steep characteristics. Thus, the problem that the required filter characteristics cannot be achieved on the integrated circuit by a simple conventional circuit configuration is a general problem widely seen in all filter configurations such as the leap frog type filter and the bi-cut type filter wherein the value relation between two resistances affects the Q value.

There is a method for connecting plural stages of the ATT in serial as a simple method for the counter measure for the above mentioned problem. However, this method has the problem that the circuit scale becomes large, the accuracy decreases and the noise level increases as the number of stages increases. Moreover, the delay of the signal increases because the signal path of the feedback system becomes long. Therefore, there is a problem that a precise filter characteristic can not be obtained. Especially, the delay of the feedback system becomes a fatal problem in the active filter for high frequency use. For the same reasons, the leap frog type filter and the bi-cut type filter are not suitable for high frequency use.

SUMMARY OF THE INVENTION

Therefore, with the foregoing in mind, it is an object of the present invention to provide an active filter circuit (a band stop filter type or a band pass filter type) having a high Q value and a high efficiency. The active filter circuit is suitable for integration.

In order to achieve the objects, an active filter circuit of the present invention includes an input terminal of the active filter circuit for inputting an input signal, an output terminal of the active filter circuit for outputting an output signal, a first differential amplifier, a second differential amplifier, a third differential amplifier, a first capacitor, a second capacitor. The input terminal of the active filer circuit is connected to a non-inverting input terminal of the first differential amplifier. An output terminal of the first differential amplifier is connected to a non-inverting input terminal of the second differential amplifier wherein the first capacitor is inserted and connected between the connection of the output terminal of the first differential amplifier to the non-inverting input terminal of the second differential amplifier and alternate current ground. An output of the second differential amplifier is connected to a non-inverting input terminal of the first differential amplifier via the second capacitor, a inverting input terminal of the first differential amplifier, a inverting input terminal of the second differential amplifier, a non-inverting input terminal of the third differential amplifier, an output terminal of the third differential amplifier and the output terminal of the active filter circuit. A inverting input terminal of the third differential amplifier is connected to alternate current ground.

This embodiment provides an active filter of a band stop filter (TRAP) having high Q value. The active filter circuit (the TRAP type) of the present invention preferably can switch its Q value between a normal Q value and a high Q value by switching between an active status and a non-active status.

Next, the active filter circuit (the TRAP type) of the present invention preferably includes plural differential amplifiers having the same function as the third differential amplifier connected parallel to the third differential amplifier respectively, wherein a non-inverting input terminal and an output terminal of each differential amplifier are connected to the output terminal of the active filter circuit, and a inverting input terminal of each differential amplifier is connected to alternate current ground.

In another preferable configuration, the active filter circuit (the TRAP type) of the present invention includes plural differential amplifiers having the same function as the third differential amplifier connected parallel to the third differential amplifier respectively. Regarding a first group of the differential amplifiers, a non-inverting input terminal and an output terminal of each differential amplifier of the first group are connected to the output terminal of the active filter circuit, and a inverting input terminal of each differential amplifier is connected to the alternate current ground. Regarding a second group of the differential amplifiers, a inverting input terminal and an output terminal of each differential amplifier of the second group are connected to the output terminal of the active filter circuit. A non-inverting input terminal of each differential amplifier is connected to alternate current ground.

In order to achieve another objects, an active filter circuit of the present invention includes an input terminal of the active filter circuit for inputting an input signal, an output terminal of the active filter circuit for outputting an output signal, a first differential amplifier, a second differential amplifier, a third differential amplifier, a first capacitor, a second capacitor. An output terminal of the first differential amplifier is connected to a non-inverting input terminal of the differential amplifier and the input terminal of the active filer circuit via the first capacitor. A non-inverting input terminal of the first differential amplifier is connected to the alternate current ground, and a inverting input terminal of the first differential amplifier is connected to an output and a inverting input terminal of the second differential amplifier. An output terminal of the second differential amplifier is connected to alternate current ground via the second capacitor, a non-inverting input terminal of the third differential amplifier, an output terminal of the third differential amplifier and the output terminal of the active filter circuit. A inverting input terminal of the third differential amplifier is connected to the alternate current ground.

This embodiment provides an active filter of a band pass filter (BPF) having high Q value. The active filter circuit of the BPF type of the present invention preferably can switch its Q value between a normal Q value and a high Q value by switching between an active status and a non-active status.

Next, the active filter circuit (the BPF type) of the present invention preferably includes plural differential amplifiers having the same function as the third differential amplifier connected parallel to the third differential amplifier respectively, wherein a non-inverting input terminal and an output terminal of each differential amplifier are connected to the output terminal of the active filter circuit, and a inverting input terminal of each differential amplifier is connected to alternate current ground.

In another preferable configuration, the active filter circuit (the BPF type) of the present invention includes plural differential amplifiers having the same function as the third differential amplifier connected parallel to the third differential amplifier respectively. Regarding a first group of the differential amplifiers, a non-inverting input terminal and an output terminal of each differential amplifier of the first group are connected to the output terminal of the active filter circuit, and a inverting input terminal of each differential amplifier is connected to the alternate current ground. Regarding a second group of the differential amplifiers, a inverting input terminal and an output terminal of each differential amplifier of the second group are connected to the output terminal of the active filter circuit, and a non-inverting input terminal of each differential amplifier is connected to alternate current ground.

Hereinafter, the concept of word "alternate current ground" in the present invention denotes not only so-called "alternate current ground" as an intermediate voltage point in the alternate electric circuit driving, but also so-called "direct current ground" such as earth voltage point (0 V), DC voltage between power source voltage and ground (i.e. 2 V).

BRIEF DESCRIPTION OF THE DRAWINGS

FIG. 10 is a circuit diagram showing a method for obtaining high Q value in a conventional band pass active filter.

FIG. 11 is a diagram showing an example circuit of a differential amplifier.

FIG. 12 is a diagram showing an example circuit of an ATT of FIG. 9 and FIG. 10.

DESCRIPTION OF THE PREFERRED EMBODIMENTS

Hereinafter, the present invention will be described by way of embodiments with reference to the accompanying drawings.

Embodiment 1

Figure 1:
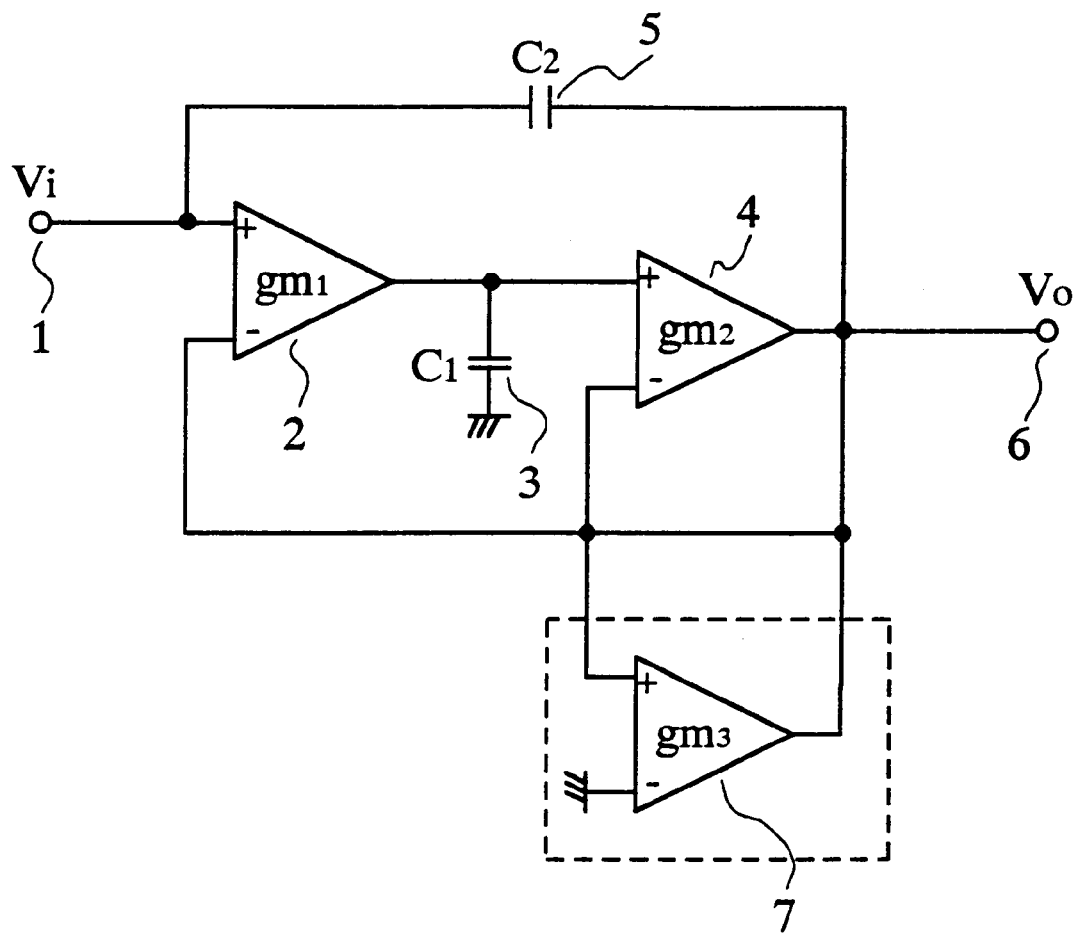
FIG. 1 is a schematic circuit diagram showing an active band stop filter having high Q value according to Embodiment 1 of the present invention.

FIG. 1 shows an active filter circuit having the high Q value according to the Embodiment 1 of this invention. In FIG. 1, a signal vi inputted from the input terminal 1 is supplied to the non-inverting input of a first differential amplifier 2. The output of the first differential amplifier 2 is connected to the non-inverting input of a second differential amplifier 4. The first capacitor 3 is connected between this connection line and the alternate current ground. The output of the second differential amplifier 4 is connected with the non-inverting input of the first differential amplifier 2 through the second capacitor 5. The output of the second differential amplifier 4 is also connected with the inverting input of the first differential amplifier 2 and the second differential amplifier 4. Furthermore, the output of the second differential amplifier 4 is also connected with the non-inverting input and the output terminal of the third differential amplifier 7. The inverting input of the third differential amplifier 7 is grounded (by connecting to the alternate current ground). The output of the second differential amplifier 4 becomes the output signal vo of the entire active filter circuit. Hereinafter, the concept of word "alternate current ground" in this Embodiment 1 and following Embodiments denotes not only so-called "alternate current ground" as an intermediate voltage point in the alternate electric circuit driving, but also so-called "direct current ground" such as earth voltage point (0 V), DC voltage between power source voltage and ground (i.e. 2 V). Also, the ground part shown in FIG. 1 and other Figures represents the alternate current ground whose concept includes so-called the "alternate current ground" as an intermediate voltage point in the alternate electric circuit driving and so-called the "direct current ground" such as earth voltage point (0 V), DC voltage between power source voltage and ground (i.e. 2 V).

Figure 7:
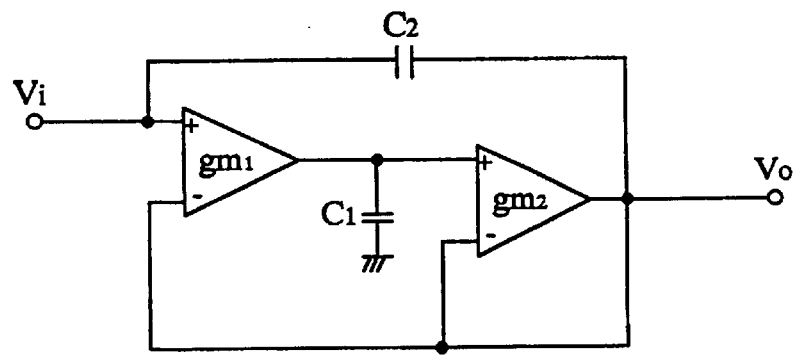
FIG. 7 is a schematic circuit diagram showing a conventional active band stop filter.
Figure 9:
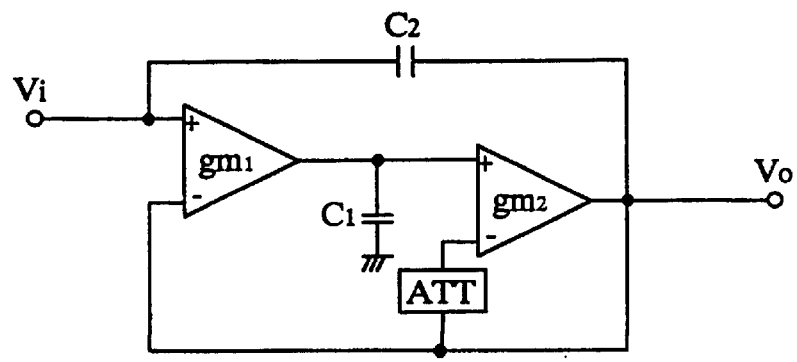
FIG. 9 is a circuit diagram showing a method for obtaining high Q value in a conventional band stop active filter.
Figure 13:
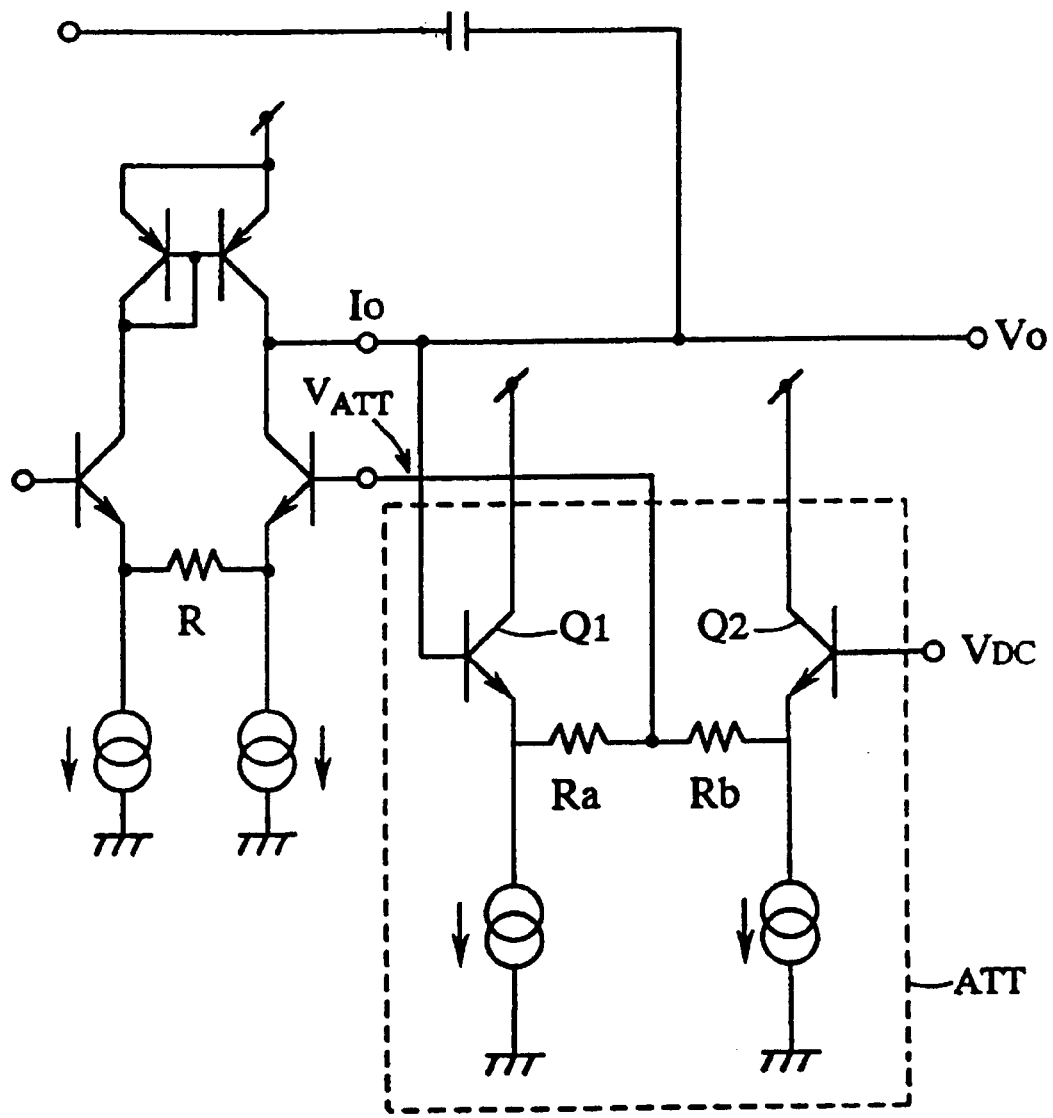
FIG. 13 is a diagram showing an example circuit of a general ATT used for a single power circuit.
Figure 14A:
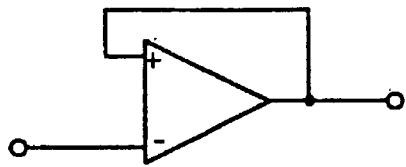
FIG. 14 is a diagram showing an other example of buffer configuration which can be used as a substitution for the buffer with a transistor $Q_1$ and $Q_2$ of FIG. 13.
Figure 14B:
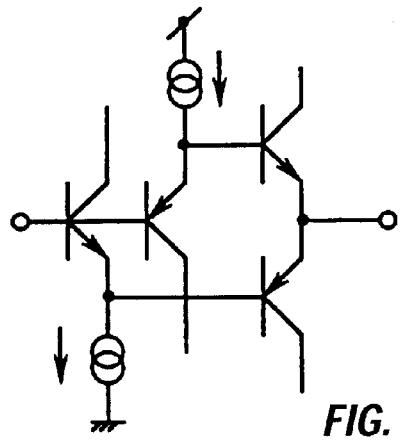
Figure 14C:
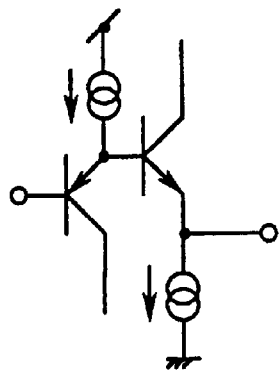
Figure 14D:
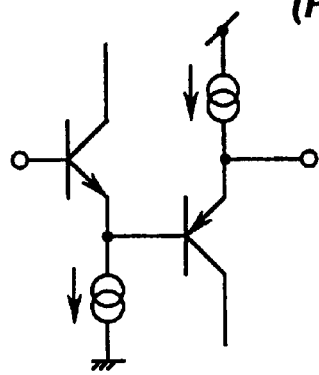
Figure 14E:
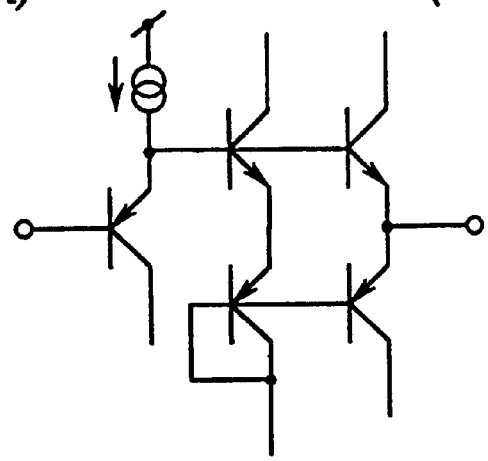
Figure 15:
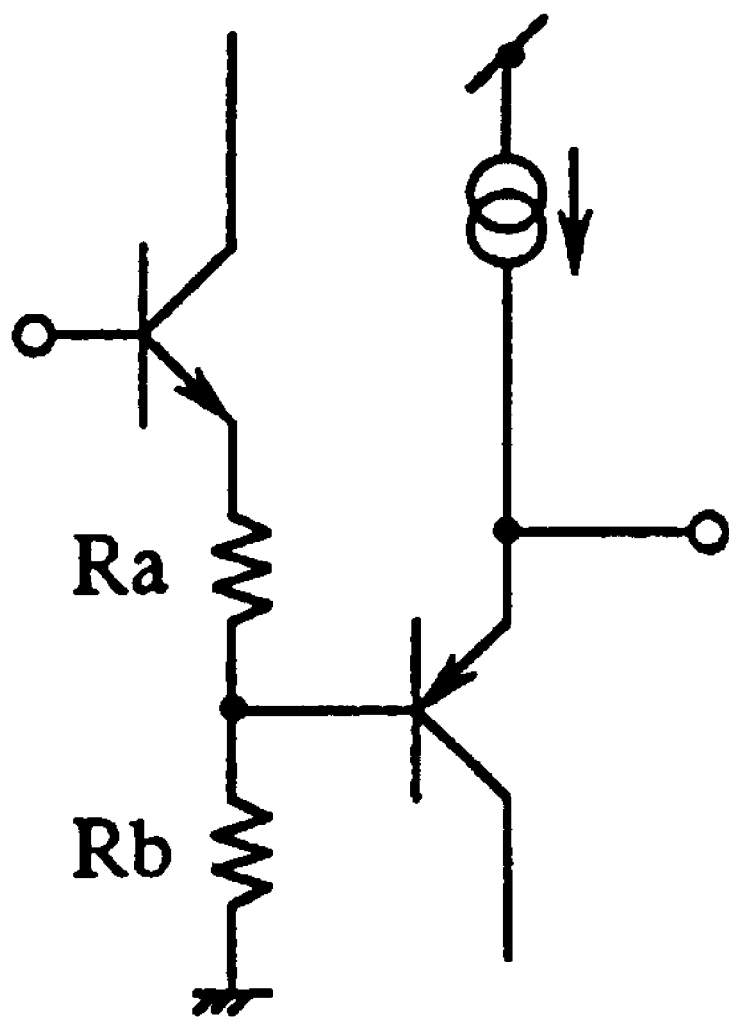
FIG. 15 is a diagram showing a concrete circuit of a general ATT composed between a power supply voltage and an alternate current ground potential.

The composition of the above-mentioned circuit shown in FIG. 1 is the same as the configuration of the conventional TRAP shown in FIG. 7 except for the third differential amplifier 7 enclosed with broken line. Regarding the third differential amplifier 7, the output is connected with the non-inverting input, the polarity is reversed to the case that the output of the second differential amplifier 4 is connected with the inverting input. If the conductance $gm_2$ of the second differential amplifier 4 and the conductance $gm_3$ of the third differential amplifier 7 are set equally, the feedback voltage of the second differential amplifier 4 and the feedback voltage of the third differential amplifier 7 cancels each other and becomes 0. This state is equivalent to the circuit adjusted the feedback signal to 0 by inserting an infinite attenuator (ATT) in the inverting input line of the second differential amplifier in FIG. 7. In short, in the conventional circuit shown in FIG. 9, it corresponds to the case that the ATT is varied as an infinity value.

In the circuit shown in FIG. 1, when the conductance $gm_2$ and the conductance $gm_3$ of the second differential amplifier and the third differential amplifier are equated, the Q value is set to an infinity value. When the Q value is set to an finite value, the conductance $gm_3$ of the third differential amplifier 7 is reduced less than the conductance $gm_2$ of the second differential amplifier 4. When the resistance $R_3$ is assumed as $1/gm_3$, the transfer function H5 for the block from the input terminal I to the output terminal 6 shown in FIG. 1 is described by the equation (Equation 11).

$$H5=(S^2+1/C_1C_2R_1R_2)/(S^2+(S/C_2R_2)(1-R_2/R_3)+1/C_1C_2R_1R_2) \quad \text{(Equation 11)}$$

The following equation (Equation 12) is reached because the second term of the denominator of Equation 11 describes Q and the third term of the denominator of Equation 11 describes $\omega 0$ the same as the Equation 5 explained in the description of the prior art.

$$\omega_0/Q=1/C_2R_2(1-R_2/R_3) \quad \text{(Equation 12)}$$

$$\omega_0^2=1/C_1C_2R_1R_2$$

If the Q value is obtained from the Equation 12, the following Equation 13 is reached.

$$Q=R_3(R_3-R_2)(C_2R_2/C_1R_1)^{1/2} \quad \text{(Equation 13)}$$

As it is understood by comparing Equation 13 and Equation 8 which is explained in the description of the prior art, $R_3/(R_3-R_2)$, which is the right term of Equation 13, corresponds to the attenuation a at the right term of Equation 8. In this Embodiment 1, the Q value can be increased by adjusting the conductance $gm_3$ ($=1/R_3$) of the third differential amplifier 7 to an appropriate value. For instance, the Q value will be described by the Equation 14 when those elements are set as follows, $R_2$=10 k$\Omega$, $R_3$=10.5 k$\Omega$, $R_2C_2$=$R_1C_1$.

$$Q=10.5/(10.5-10)*1=21 \quad \text{(Equation 14)}$$

In short, Q=21 can be achieved by setting the value of the $R_3$ as 5% increment of the value of the $R_2$.

Next, Q=41 is achieved when $R_3$ k$\Omega$ is set to 10.25 k$\Omega$, in other words, to a 2.5% increment of the value of the $R_2$ as shown by the Equation 15.

$$Q=10.25/(10.25-10)*1=41 \quad \text{(Equation 15)}$$

The value of the $R_3$ should be larger than that of the $R_2$. The value of the $R_3$ can come close to the value of the $R_2$ up to the limit decided due to a relative difference error between the $R_2$ and the $R_3$. In a recent IC process technology, the relative error of two highly accurate resistances can be assumed to be less than 1% by the floating process in the same size, the same direction, and the same shape. Therefore, according to this Embodiment 1, the circuit integration of the band stop filter (TRAP) having a high Q value more than 20 becomes easy.

Moreover, if switching the status of the third differential amplifier 7 between an active status and a non-active status is enabled, switching between the Q value initialized by $R_1$, $R_2$, $C_1$ and $C_2$ when the third amplifier 7 is at non-active status and the Q value when the third amplifier 7 is at active status can be achieved. For instance, an appropriate Q value can be selected in the quality assurance test stage. Therefore, the Q value adjustment can contribute for achieving the accuracy improvement, the stable processing and the high efficiency of IC.

The variable conductance circuit can be utilized as the first differential amplifier 2, the second differential amplifier 4 and the third differential amplifier 7.

Embodiment 2

Figure 2:
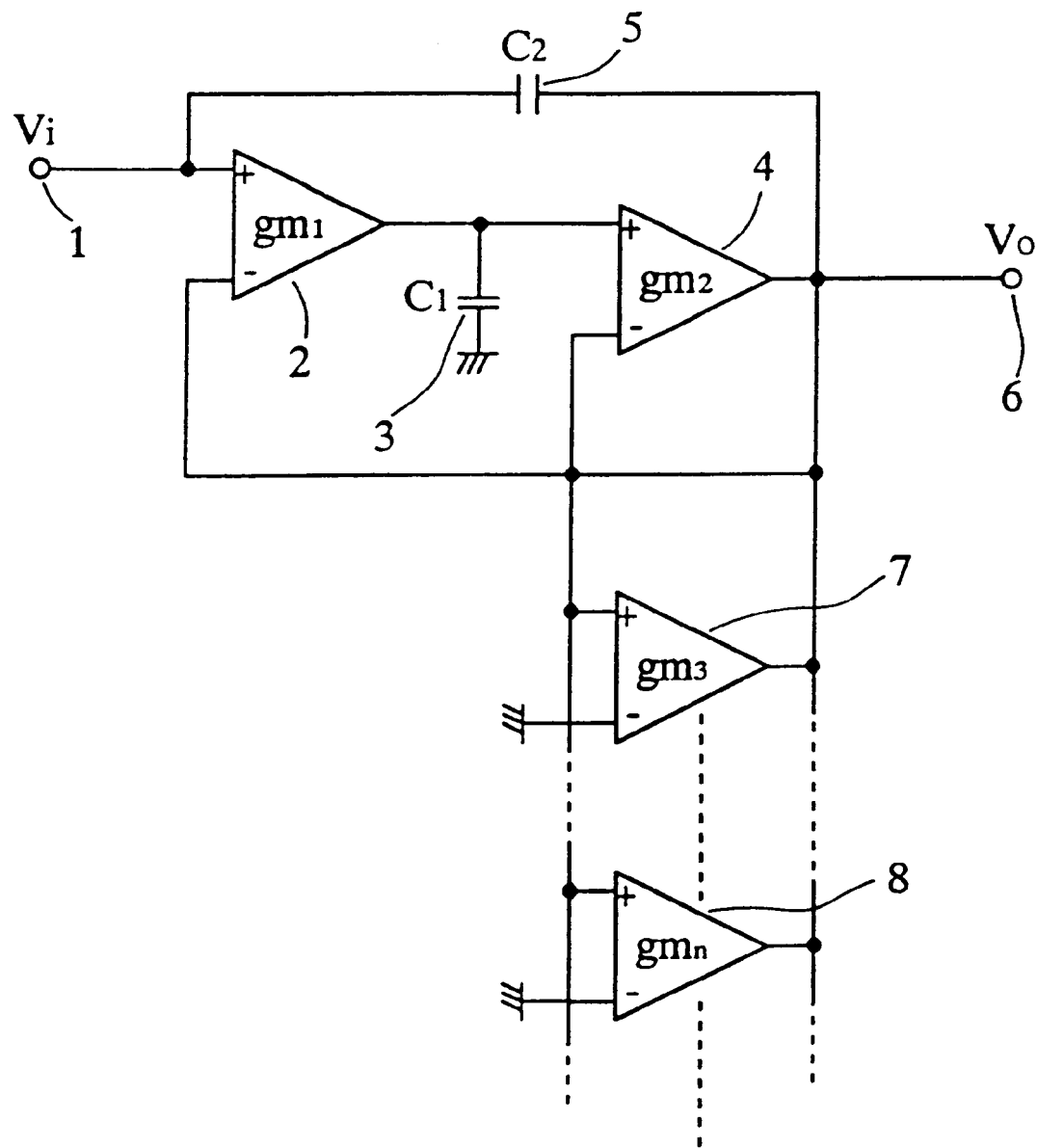
FIG. 2 is a schematic circuit diagram showing an active band stop filter having high Q value according to Embodiment 2 of the present invention.

FIG. 2 shows an active filter circuit having high Q value according to the Embodiment 2 of this invention. The active filter circuit of this Embodiment 2 includes the circuit structure wherein plural differential amplifiers 8 (the fourth and following differential amplifiers) having the same function as the third differential amplifier 7 are connected in parallel to the third differential amplifier 7 of the Embodiment 1 shown in FIG. 1. The non-inverting input and the output terminal of the differential amplifier 8 are connected with the output terminal 6 of the filter circuit, and the inverting input is grounded (by connecting to the alternate current ground). A transfer function H6=vo/vi of the block from the input terminal 1 to the output terminal 6 of the active filter having such a configuration is calculated by Equation 16 as in the Embodiment 1. Here, the conductance of the differential amplifier 8 is assumed as $gm_n$ (n=4,5, . . . ) and $R_n$ is assumed as $R_n=1gm_n$.

$$H6=(S^2+1/C_1C_2R_1R_2)/(S^2+S/C_2R_2(1-R_2/R_3 \ldots R_2/R_n \ldots )+1/$$

$C_1C_2R_1R_2$) (Equation 16)

The Q value is described as Equation 17 by using Equation 16 as in the Embodiment 1.

$$Q=1/(1-R_2/R_3 \ldots R_2/R_n \ldots)*(C_2R_2/C_1R_1)^{1/2}$$ (Equation 17)

The fourth and following differential amplifiers work for enhancing the Q value as understood from this equation. Moreover, the Q value can be varied among plural high Q values by enabling the switching of the status of the third, the fourth and following differential amplifiers between the active status and the non-active status. Variable conductance circuits can be used for each differential amplifier as in the Embodiment 1.

Embodiment 3

Figure 3:
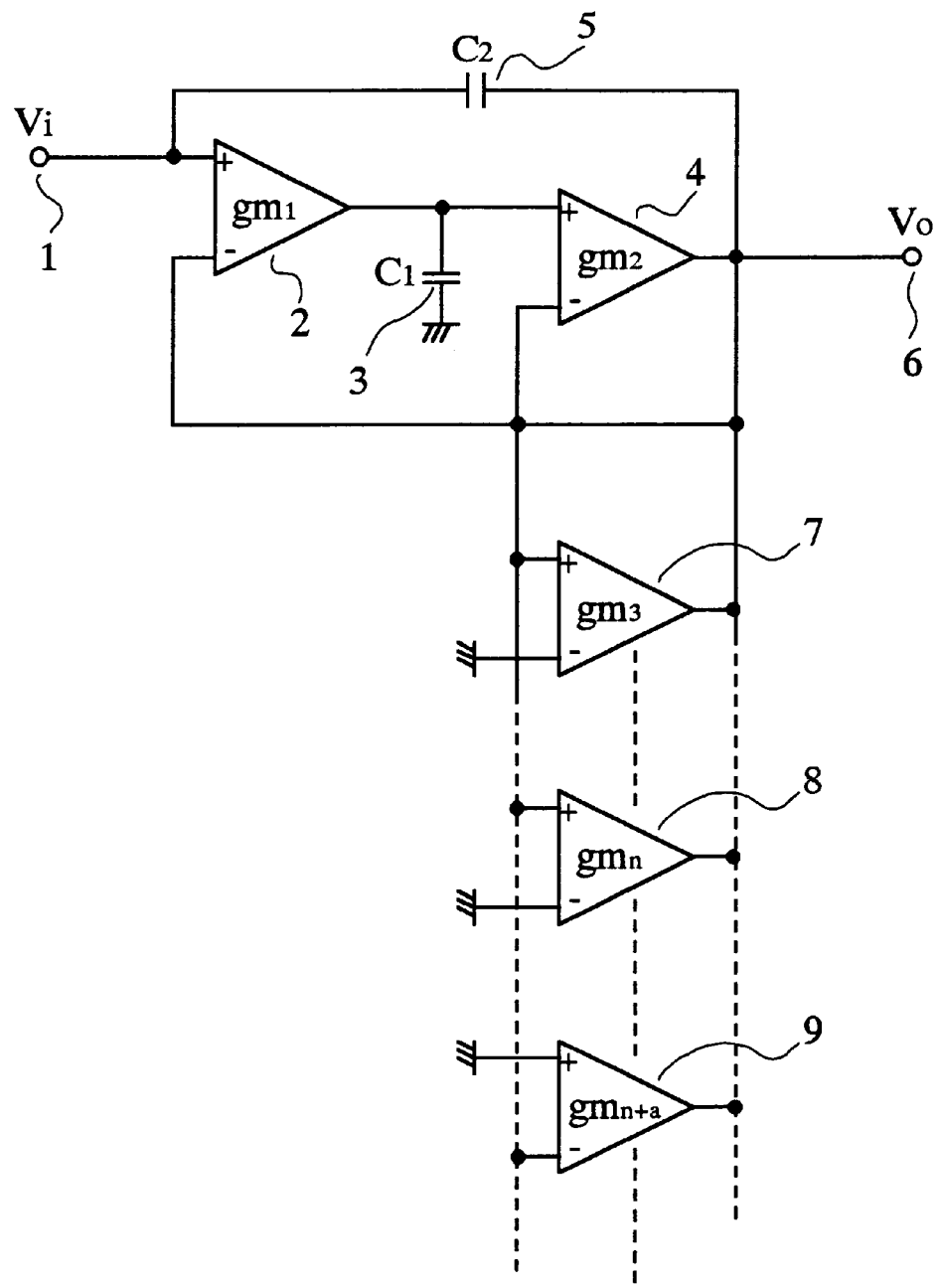
FIG. 3 is a schematic circuit diagram showing an active band stop filter having high Q value according to Embodiment 3 of the present invention.

FIG. 3 shows an active filter circuit having high Q value according to the Embodiment 3 of this invention.

The active filter of this Embodiment 3, plural differential amplifiers (the fourth and following differential amplifiers) having the same function as the third differential amplifier 7 shown in FIG. 1 are connected in parallel to the third differential amplifier 7. Regarding a group of the differential amplifier 8, the non-inverting input terminal and the output terminal are connected to the output terminal 6 while the inverting input terminal is grounded (by connecting to the alternate current ground). Regarding the remaining group of differential amplifiers 9, the inverting input terminal and the output terminal are connected to the output terminal 6 while the non-inverting input terminal is grounded (by connecting to the alternate current ground).

A transfer function H7=vo/vi of the block from the input terminal 1 to the output terminal 6 of the high Q active filter circuit having such a configuration is calculated as Equation 18 as in the Embodiment 2. Here, the conductance of the differential amplifier 8 whose inverting input is grounded is assumed as $gm_n$, and the conductance of the differential amplifier 9 whose non-inverting input is grounded is assumed as $gm_{n+a}$, and the $R_n$ is assumed as $R_{n+a}=1/gm_{n+a}$.

$$H7=(S^2+1/C_1C_2R_1R_2)/(S^2+S/C_2R_2(1-R_2/R_3 \ldots R_2/R_n \ldots +R_2/R_{n+a}+ \ldots)+1/C_1C_2R_1R_2)$$ (Equation 18)

The Q value is described as Equation 19 by using Equation 18.

$$Q=1/(1-R_2/R_3 \ldots R_2/R_n \ldots +R_2/R_{n+a}+ \ldots)*(C_2R_2/C_1R_1)^{1/2}$$ (Equation 19)

As understood from this equation, among the fourth and following differential amplifiers, the differential amplifiers 8 whose reversing input is grounded work for enhancing the Q value, the differential amplifiers 9 whose non-inverting input is grounded work for lowering the Q value. In short, the active filter circuit shown in FIG. 3, the $gm_n$ enhances the Q value and the $gm_{n+a}$ lowers the Q value. Moreover, the Q value can be varied among plural high Q values by enabling the switching of the status of the third, the fourth and following differential amplifiers between the active status and the non-active status. The differential amplifier 8 which enhances the Q value and the differential amplifier 9 which lowers the Q value are combined arbitrarily, multiple Q values can be set by using minimum number of differential amplifiers. Variable conductance circuits can be used for each differential amplifier as in the Embodiment 1.

Embodiment 4

Figure 4:
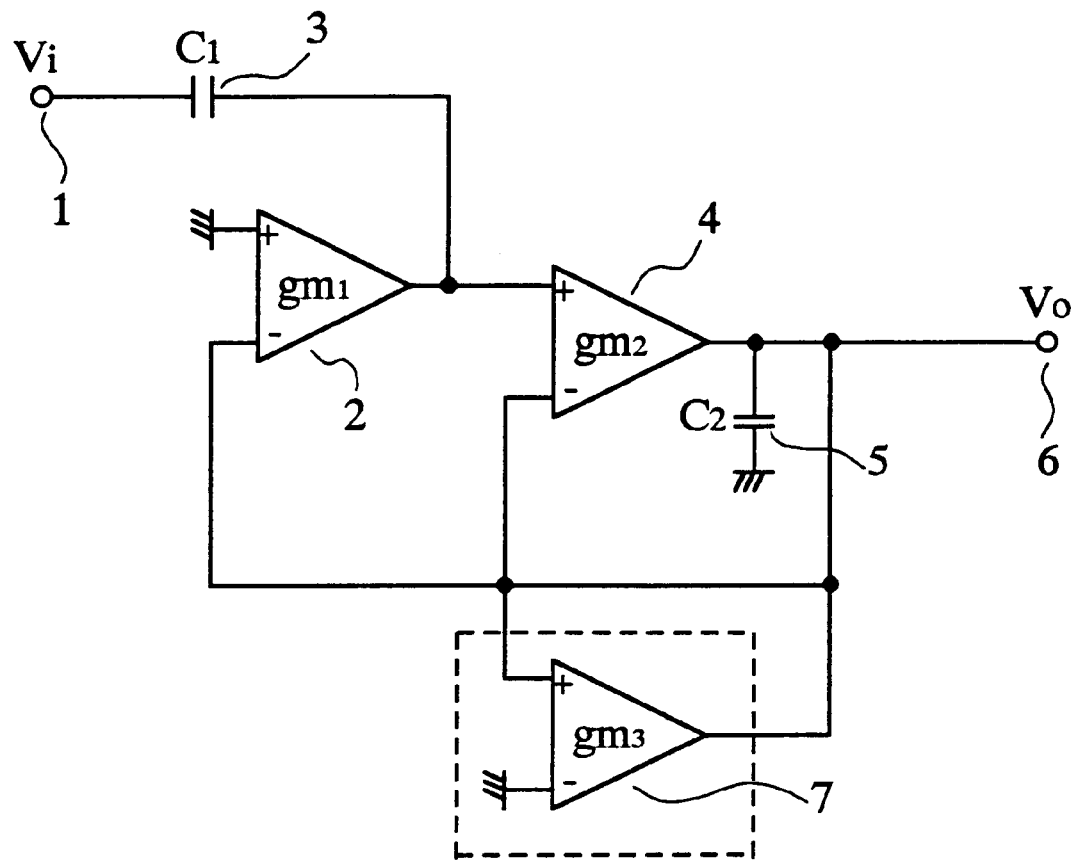
FIG. 4 is a schematic circuit diagram showing an active band pass filter having high Q value according to Embodiment 4 of the present invention.

FIG. 4 shows an active filter circuit having high Q value according to the Embodiment 4 of this invention.

The signal vi inputted by the input terminal 1 is provided to the connection line between the output of the first differential amplifier 2 and the non-inverting input of the second differential amplifier 4 via the first capacitor 3. Non-inverting input of the first differential amplifier 2 is grounded (by connecting to the alternate current ground), and the inverting input of the first differential amplifier 2 is connected with the output of the second differential amplifier 4 and the inverting input of the second differential amplifier 4. The second capacitor 5 is connected between the output of the second differential amplifier 4 and the alternate current ground. In addition, the output of the second differential amplifier 4 is connected with the non-inverting input of the third differential amplifier 7 and the output of the third differential amplifier 7. The inverting input of the third differential amplifier 7 is grounded (by connecting to the alternate current ground). Then, the output of the second differential amplifier 4 becomes the output signal vo of the entire active filter circuit.

Figure 8:
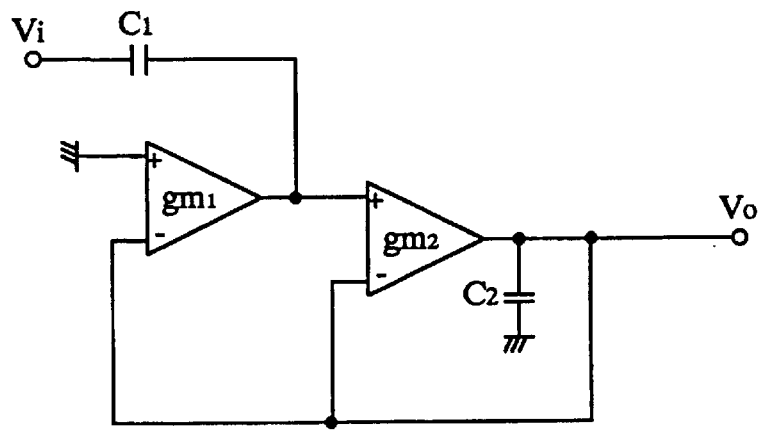
FIG. 8 is a schematic circuit diagram showing a conventional active band pass filter.

The configuration of the above-mentioned FIG. 4 is the same as that of the conventional BPF shown in FIG. 8 except for the third differential amplifier 7 enclosed with broken line. Regarding the third differential amplifier 7, the output is connected with the non-inverting input. The polarity has reversed to the case of the second differential amplifier 4 whose output is connected with the inverting input. Because of this feature, the same effect as with the case that the ATT is added to the inverting input line of the second differential amplifier 4 can be achieved as in Embodiment 1. Therefore, the adjustment for the Q value of the BPF circuit becomes possible. Moreover, high performance can be achieved as in Embodiment 1 by switching the state of the third differential amplifier 7 between the non-active status and the active status.

In FIG. 4, the transfer function H8 for the block from the input terminal 1 to the output terminal 6 can be described as Equation 20 on the condition that $R_1=1/gm_1$, $R_2=1/gm_2$, and $R_3=1/gm_3$.

$$H8=(S/C_2R_2)/(S^2+(S/C_2R_2)(1-R_2/R_3)+1/C_1C_2R_1R_2)$$ (Equation 20)

The second term of the denominator of Equation 20 describes the Q value, Equation 12 is proven the same case as Embodiment 1, and the Q value becomes the value described by Equation 13.

Therefore, according to this Embodiment 4, the circuit integration of the band pass filter (BPF) having high Q value more than 20 becomes easy as in Embodiment 1. Variable conductance circuits can be used for first differential amplifier 2, the second differential amplifier 4 and the third differential amplifier 7 as in Embodiment 1.

Embodiment 5

Figure 5:
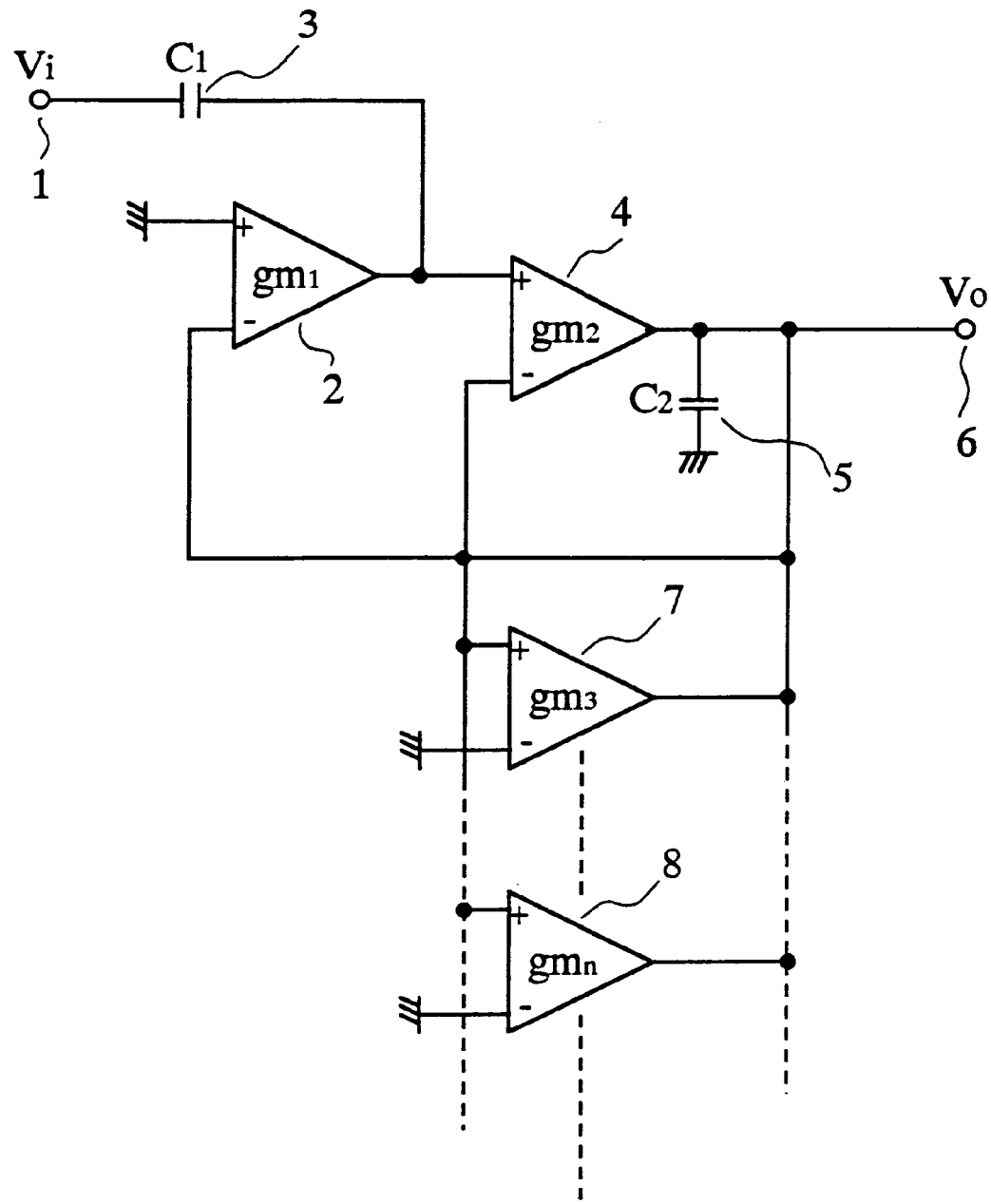
FIG. 5 is a schematic circuit diagram showing an active band pass filter having high Q value according to Embodiment 5 of the present invention.

FIG. 5 shows an active filter circuit having high Q value according to the Embodiment 5 of this invention.

The active filter of this Embodiment 5 includes the circuit structure wherein plural differential amplifiers 8 (the fourth and following differential amplifiers) having the same function as the third differential amplifier 7 are connected in parallel to the third differential amplifier 7 of the Embodiment 4 as shown in FIG. 4. The non-inverting input and the output of the fourth and following differential amplifiers 8 are connected with the output terminal 6 of the filter circuit, and the inverting input is grounded (by connecting to the alternate current ground). The transfer function H9=vo/vi of the block from the input terminal 1 to the output terminal 6 of the active filter having such a configuration is calculated as Equation 18 as in Embodiment 1. Here, the conductance of the differential amplifier 8 is assumed as $gm_n$ (n=4,5, . . . ), and the $R_n$ is assumed as $R_n=1/gm_n$.

$$H9=(S/C_2R_2)/(S^2+S/C_2R_2(1-R_2/R_3 \ldots R_2/R_n \ldots)+1/C_1C_2R_1R_2)$$ (Equation 21)

When the Q value is calculated by using Equation 21, the Q value will be described by Equation 17 as in Embodiment 2. The fourth and following differential amplifiers work for enhancing the Q value as understood from this equation. Moreover, the Q value can be varied among plural high Q values by enabling the switching of the status of the third, fourth and following differential amplifiers between the active status and the non-active status. Variable conductance circuits can be used for each differential amplifier as in Embodiment 1.

Embodiment 6

Figure 6:
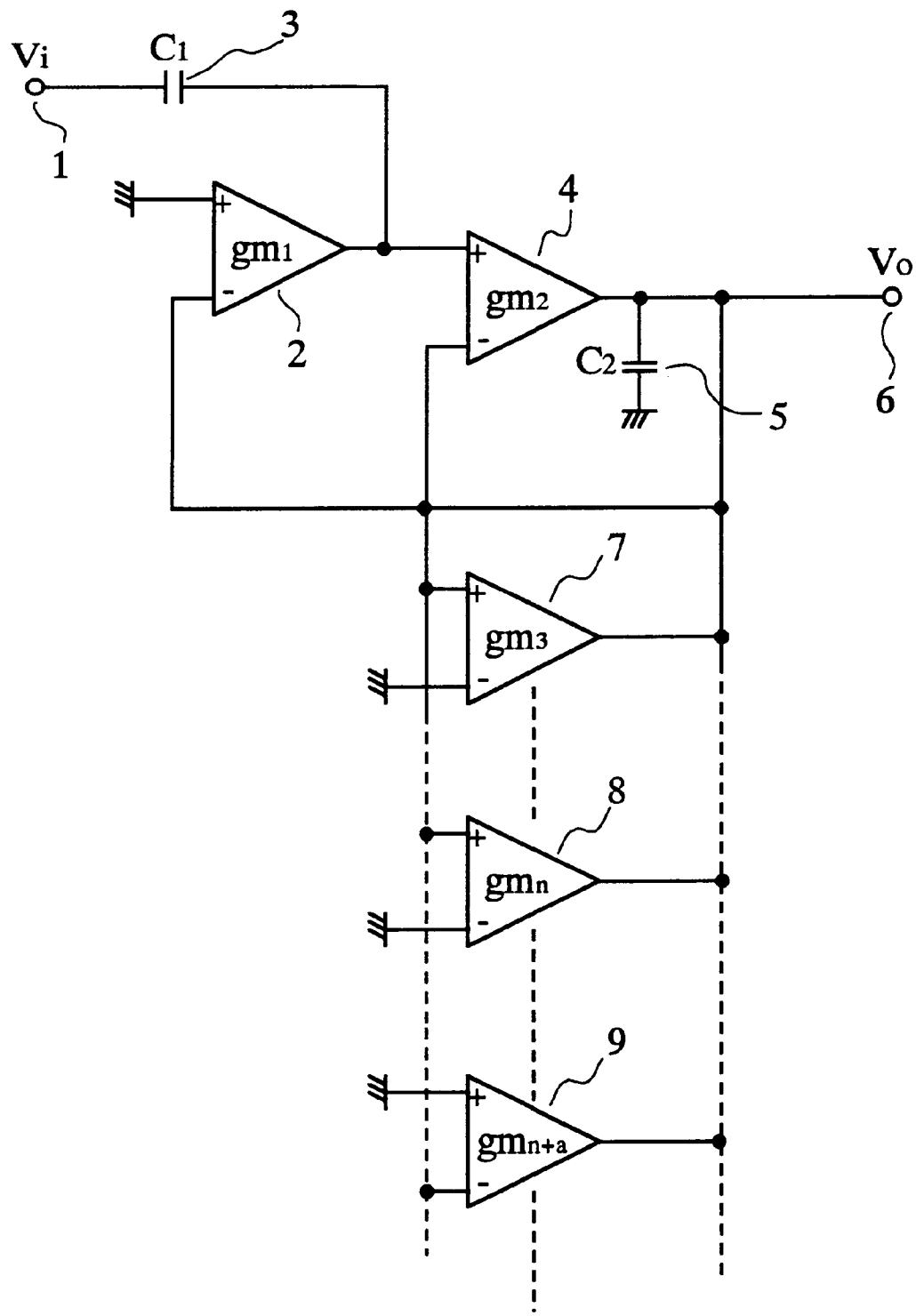
FIG. 6 is a schematic circuit diagram showing an active band pass filter having high Q value according to Embodiment 6 of the present invention.

FIG. 6 shows an active filter circuit having high Q value according to the Embodiment 6 of this invention.

The active filter of this Embodiment 6, plural differential amplifiers (the fourth and following differential amplifiers) having the same function as the third differential amplifier 7 of Embodiment 5 shown in FIG. 5 are connected in parallel to the third differential amplifier 7. Regarding a group of the differential amplifier 8, the non-inverting input and the output are connected to the output terminal 6, while the inverting input is grounded (by connecting to the alternate current ground). Regarding rest group of the differential amplifiers 9, the inverting input and the output are connected to the output terminal 6, while the non-inverting input is grounded (by connecting to the alternate current ground). The transfer function H10=vo/vi of the block from the input terminal 1 to the output terminal 6 of the active filter circuit having such a configuration is calculated as Equation 20. Here, among the fourth and following differential amplifiers, the conductance of the differential amplifier 8 whose inverting input is grounded is assumed as $gm_n$, and the conductance of the differential amplifier 9 whose non-inverting input is grounded is assumed as $gm_{n+a}$, the $R_n$ is assumed as $R_n=1/gm_n$, the $R_{n+\alpha}$ is assumed as $R_{n+a}=1/gm_{n+a}$.

$$H10=(S/C_2R_2)/(S^2+S/C_2R_2(1-R_2/R_3 \ldots R_2/R_n \ldots +R_2/R_{n+a}+ \ldots )+1/C_1C_2R_1R_2)$$ (Equation 22)

When the Q value is calculated by using Equation 22, the Q value will be described by Equation 19 as in Embodiment 3. As a result, a high performance and high Q band pass active filter can be achieved. In short, the active filter shown in FIG. 6, $gm_n$ enhances the Q value and $gm_{n+a}$ lowers the Q value. Moreover, the Q value can be varied among plural high Q values by enabling the switching of the status of the third, fourth and following differential amplifiers between the active status and the non-active status. The differential amplifier 8 which enhances the Q value and the differential amplifier 9 which lowers the Q value are combined arbitrarily, multiple Q values can be set by using minimum number of differential amplifiers. The variable conductance circuits can be used for each differential amplifier.

As described above, the active filter circuit of the present invention can achieve high Q value by the third differential amplifiers (preferably including the fourth and following plural differential amplifiers) in addition to the first capacitor, the second capacitor, the first differential amplifier and the second differential amplifier. Moreover, it is suitable for integration.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. An active filter circuit comprising
    an input terminal of the active filter circuit for inputting an input signal;
    an output terminal of the active filter circuit for outputting an output signal;
    a first differential amplifier;
    a second differential amplifier;
    a third differential amplifier;
    a first capacitor; and
    a second capacitor,
    wherein an input terminal of the active filter circuit is connected to a non-inverting input terminal of the first differential amplifier,
    an output terminal of the first differential amplifier is connected to a non-inverting input terminal of the second differential amplifier wherein the first capacitor is connected between the connection of the output terminal of the first differential amplifier to the non-inverting input terminal of the second differential amplifier and ground,
    an output of the second differential amplifier is connected to a non-inverting input terminal of the first differential amplifier via the second capacitor, an inverting input terminal of the first differential amplifier, an inverting input terminal of the second differential amplifier, a non-inverting input terminal of the third differential amplifier, and output terminal of the third differential amplifier and the output terminal of the active filter circuit, and
    an inverting input terminal of the third differential amplifier is connected to ground.

2. The active filter circuit according to claim 1, wherein the third differential amplifier switches between active status and non-active status.

3. The active filter circuit according to claim 1 further comprising a plurality of differential amplifiers having the same function as the third differential amplifier connected parallel to the third differential amplifier respectively, wherein a non-inverting input terminal and an output terminal of each differential amplifier are connected to the output terminal of the active filter circuit, and a inverting input terminal of each differential amplifier is connected to the ground.

4. The active filter circuit according to claim 1 further comprising a plurality of differential amplifiers having the same function as the third differential amplifier connected parallel to the third differential amplifier respectively,
    wherein in a first group of the differential amplifiers, a non-inverting input terminal and an output terminal of each differential amplifier of the first group are connected to the output terminal of the active filter circuit, and a inverting input terminal of each differential amplifier is connected to the ground, and
    in a second group of the differential amplifiers, a inverting input terminal and an output terminal of each differential amplifier of the second group are connected to the output terminal of the active filter circuit, and a non-inverting input terminal of each differential amplifier is connected to the ground.

5. An active filter circuit comprising:

an input terminal of the active filter circuit for inputting an input signal;

an output terminal of the active filter circuit for outputting an output signal;

a first differential amplifier;

a second differential amplifier;

a third differential amplifier;

a first capacitor; and a second capacitor, wherein an output terminal of the first differential amplifier is connected to a non-inverting input terminal of the differential amplifier and the input terminal of the active filter circuit via the first capacitor, a non-inverting input terminal of the first differential amplifier is connected to ground, and an inverting input terminal of the first differential amplifier is connected to an output and an inverting input terminal of the second differential amplifier, an output terminal of the second differential amplifier is connected to ground via the second capacitor, a non-inverting input terminal of the third differential amplifier, an output terminal of the third differential amplifier and the output terminal of the active filter circuit, an inverting input terminal of the third differential amplifier is connected to the ground.

6. The active filter circuit according to claim 5, wherein the third differential amplifier switches between active status and non-active status.

7. The active filter circuit according to claim 5 further comprising a plurality of differential amplifiers having the same function as the third differential amplifier connected parallel to the third differential amplifier respectively, wherein a non-inverting input terminal and an output terminal of each differential amplifier are connected to the output terminal of the active filter circuit, and a inverting input terminal of each differential amplifier is connected to ground.

8. The active filter circuit according to claim 5 further comprising a plurality of differential amplifiers having the same function as the third differential amplifier connected parallel to the third differential amplifier respectively, wherein a first group of the differential amplifiers, a non-inverting input terminal and an output terminal of each differential amplifier of the first group are connected to the output terminal of the active filter circuit, and an inverting input terminal of each differential amplifier is connected to the ground, a second group of the differential amplifiers, an inverting input terminal and an output terminal of each differential amplifier of the second group are connected to the output terminal of the active filter circuit, and a non-inverting input terminal of each differential amplifier is connected to ground.

* * * * *